(12) United States Patent
Lin et al.

(10) Patent No.: US 9,768,073 B1
(45) Date of Patent: Sep. 19, 2017

(54) SEMICONDUCTOR DEVICE HAVING DUAL CHANNELS, COMPLEMENTARY SEMICONDUCTOR DEVICE AND MANUFACTURING METHOD THEREOF

(71) Applicant: Taiwan Semiconductor Manufacturing Co., Ltd., Hsinchu (TW)

(72) Inventors: Yi-Chung Lin, Tainan (TW); Chen-Chieh Chiang, Kaohsiung (TW); Chi-Cherng Jeng, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/054,134

(22) Filed: Feb. 26, 2016

(51) Int. Cl.
*H01L 21/336* (2006.01)
*H01L 29/66* (2006.01)
*H01L 29/78* (2006.01)
*H01L 21/8238* (2006.01)
*H01L 29/10* (2006.01)
*H01L 29/423* (2006.01)
*H01L 27/092* (2006.01)

(52) U.S. Cl.
CPC ............ *H01L 21/823807* (2013.01); *H01L 21/823828* (2013.01); *H01L 21/823878* (2013.01); *H01L 27/092* (2013.01); *H01L 29/1033* (2013.01); *H01L 29/4236* (2013.01)

(58) Field of Classification Search
CPC ............ H01L 21/845; H01L 27/1211; H01L 29/78696; H01L 27/092; H01L 29/0847; H01L 29/1033; H01L 29/785
See application file for complete search history.

(56) References Cited

U.S. PATENT DOCUMENTS

| 2005/0051825 A1* | 3/2005 | Fujiwara | H01L 29/41733 257/308 |
| 2012/0241826 A1* | 9/2012 | Satoh | H01L 27/228 257/295 |
| 2015/0236094 A1* | 8/2015 | Hsiao | H01L 29/1033 257/329 |

* cited by examiner

Primary Examiner — Raj R Gupta
(74) Attorney, Agent, or Firm — Jianq Chyun IP Office

(57) ABSTRACT

Provided is a semiconductor device having dual channels including a first portion and a second portion sharing a buried gate pillar. The buried gate pillar extends from a first surface of a substrate toward a second surface opposite to the first surface. The first portion includes the buried gate pillar, a first gate dielectric layer at a first sidewall of the buried gate pillar and a first doped region set aside the first gate dielectric layer. A first channel is provided in the substrate between the first gate dielectric layer and the first doped region set. The second portion includes the buried gate pillar, a second gate dielectric layer at a second sidewall of the buried gate pillar and a second doped region set aside the second gate dielectric layer. A second channel is provided in the substrate between the second gate dielectric layer and the second doped region set.

20 Claims, 17 Drawing Sheets

US 9,768,073 B1

SEMICONDUCTOR DEVICE HAVING DUAL CHANNELS, COMPLEMENTARY SEMICONDUCTOR DEVICE AND MANUFACTURING METHOD THEREOF

BACKGROUND

The semiconductor integrated circuit (IC) industry has experienced rapid growth. Over the course of this growth, functional density of the devices has generally increased by the device feature size.

This scaling down process generally provides benefits by increasing production efficiency, lower costs, and/or improving performance. Such scaling down has also increased the complexities of processing and manufacturing ICs and, for these advances to be realized similar developments in IC fabrication are needed.

DETAILED DESCRIPTION

Figure 1:
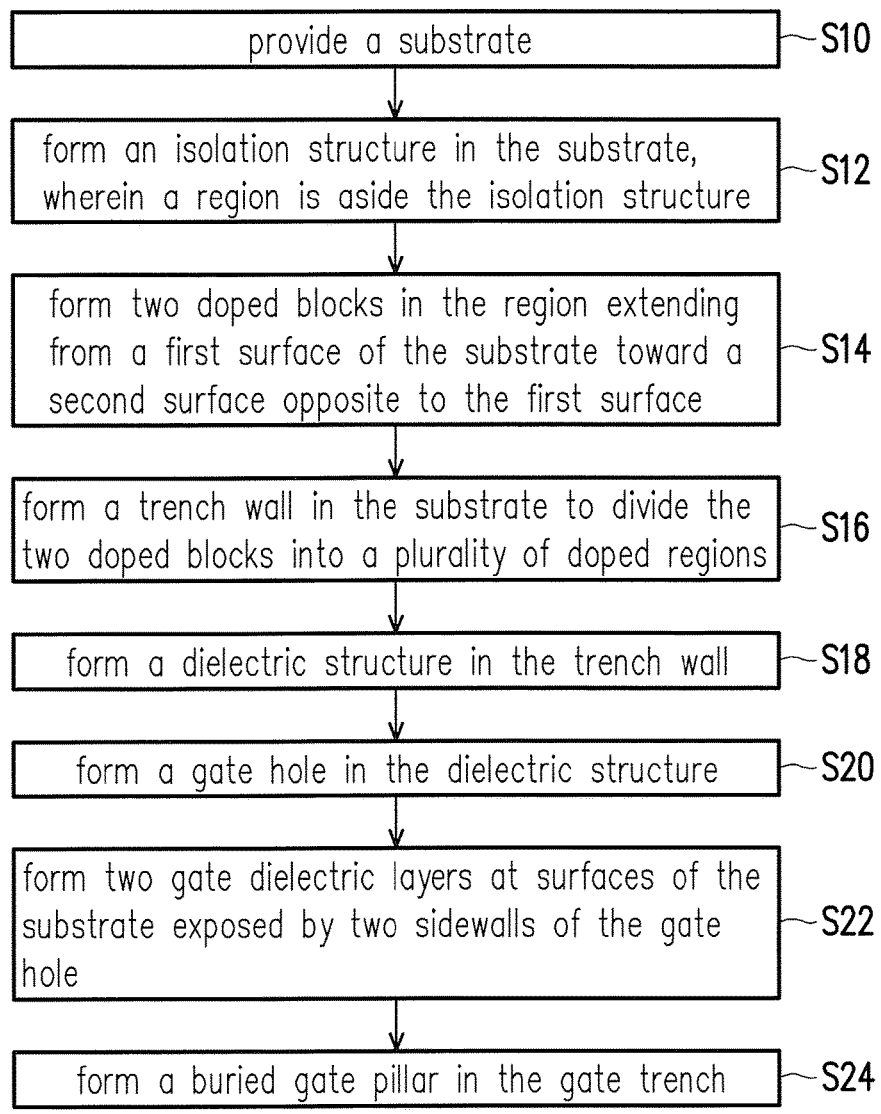
FIG. 1 is a flowchart illustrating a manufacturing method of a semiconductor device having a buried gate pillar according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
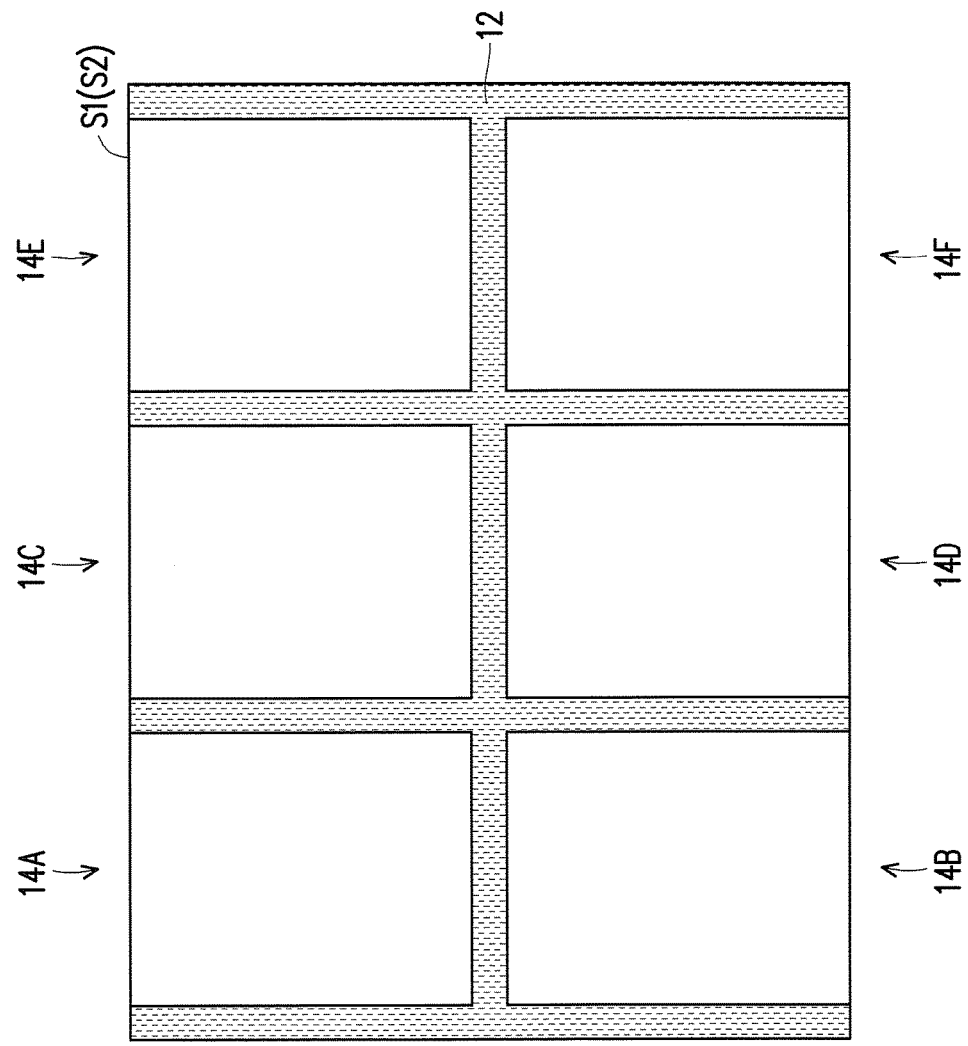
FIGS. 2A to 2N are top views illustrating a manufacturing method of a semiconductor device having a buried gate pillar according to some embodiments of the disclosure.

FIG. 1 is a flowchart illustrating a manufacturing method of a semiconductor device having a buried gate pillar according to some embodiments of the disclosure. FIGS. 2A to 2N are top views illustrating a manufacturing method of a semiconductor device having a buried gate pillar according to some embodiments of the disclosure.

Referring to FIG. 1 and FIG. 2A, at step S10, a substrate 10 is provided. The substrate 10 is a semiconductor substrate, for example. In some embodiments, the substrate 10 is made of silicon or other semiconductor materials. Alternatively or additionally, the substrate 10 includes other elementary semiconductor materials such as germanium, gallium, arsenic, or other suitable semiconductor materials. In some embodiments, the substrate 10 may further include other features such as various doped regions, a buried layer, and/or an epitaxy layer. Moreover, in some embodiments, the substrate 10 is made of an alloy semiconductor such as silicon germanium, silicon germanium carbide, gallium arsenic phosphide, or gallium indium phosphide. Furthermore, the substrate 10 may be a semiconductor on insulator such as silicon on insulator (SOI) or silicon on sapphire.

Then, referring to FIG. 1 and FIG. 2A, at Step S12, an isolation structure 12 is formed in the substrate 10. The isolation structure 12 utilize isolation technology, such as local oxidation of silicon (LOCOS) or shallow trench isolation (STI) to electrically isolate the various regions. If the isolation regions are made of STIs, the STI region comprises silicon oxide, silicon nitride, silicon oxynitride, other suitable materials, or a combination thereof. In some examples, the filled trench has a multi-layer structure such as a thermal oxide liner layer filled with silicon nitride or silicon oxide.

In some embodiments, the isolation structure 12 divides the substrate 10 into a plurality of regions 14A to 14F. The regions 14A, 14C, and 14E are arranged along a first direction D1, and the regions 14B, 14D, and 14F are arranged along the first direction D1. The regions 14A and 14B are arranged along a second direction D2, the regions 14C and 14D are arranged along the second direction D2, and the regions 14E and 14F are arranged along the second direction. In some embodiments, the regions 14A and 14F are arranged as an array. The regions 14A, 14C, and 14E are arranged in a first row, and the regions 14B, 14D, and 14F are arranged in a second row. The regions 14A and 14B are arranged in a first column, the regions 14C and 14D are arranged in a second column, and the regions 14E and 14F are arranged in a third column.

Subsequently, referring to FIG. 1 and FIG. 2E, at Step S14, a doped block set, i.e., doped blocks 16A1 and 16A2, are formed in the region 14A. The doped blocks 16A1 and 16A2 extend from a first surface S1 of the substrate 10 toward a second surface S2 opposite to the first surface S1. The doped blocks 16A1 and 16A2 are arranged along the first direction D1 and are separated from each other in a distance. The doped blocks 16A1 and 16A2 are also separated from the adjacent region 14B or 14C with the isolation structure 12. Similarly, a doped block set is formed in the region 14B, i.e., doped blocks 16B1 and 16B2. The same arrangement applies to the regions 14C to 14F. In some embodiments, the doped regions 16A1, 16A2, 16B1, 16B2, 16C1, and 16C2 formed in the regions 14A to 14C are of the same conductivity type. The doped regions 16D1, 16D2, 16E1, 16E2, and 16F1, and 16F2 formed in the regions 14D to 14F are of the same conductivity type. In some embodiments, the doped regions 16A1, 16A2, 16B1, 16B2, 16C1, and 16C2 are doped with a dopant of a first conductivity type, for example, whereas the doped regions 16D1, 16D2, 16E1, 16E2, and 16F1, and 16F2 are doped with a second conductivity type, for example. In some exemplary embodiments, the dopant of the first conductivity type is a P-type dopant, such as boron or $BF_2$, and the dopant of the second conductivity type is an N-type dopant, such as phosphorous or arsenic. In some other exemplary embodiments, the dopant of the first conductivity type is an N-type dopant, such as phosphorous or arsenic, and the dopant of the second conductivity type is a P-type dopant, such as boron or $BF_2$.

Figure 2B:
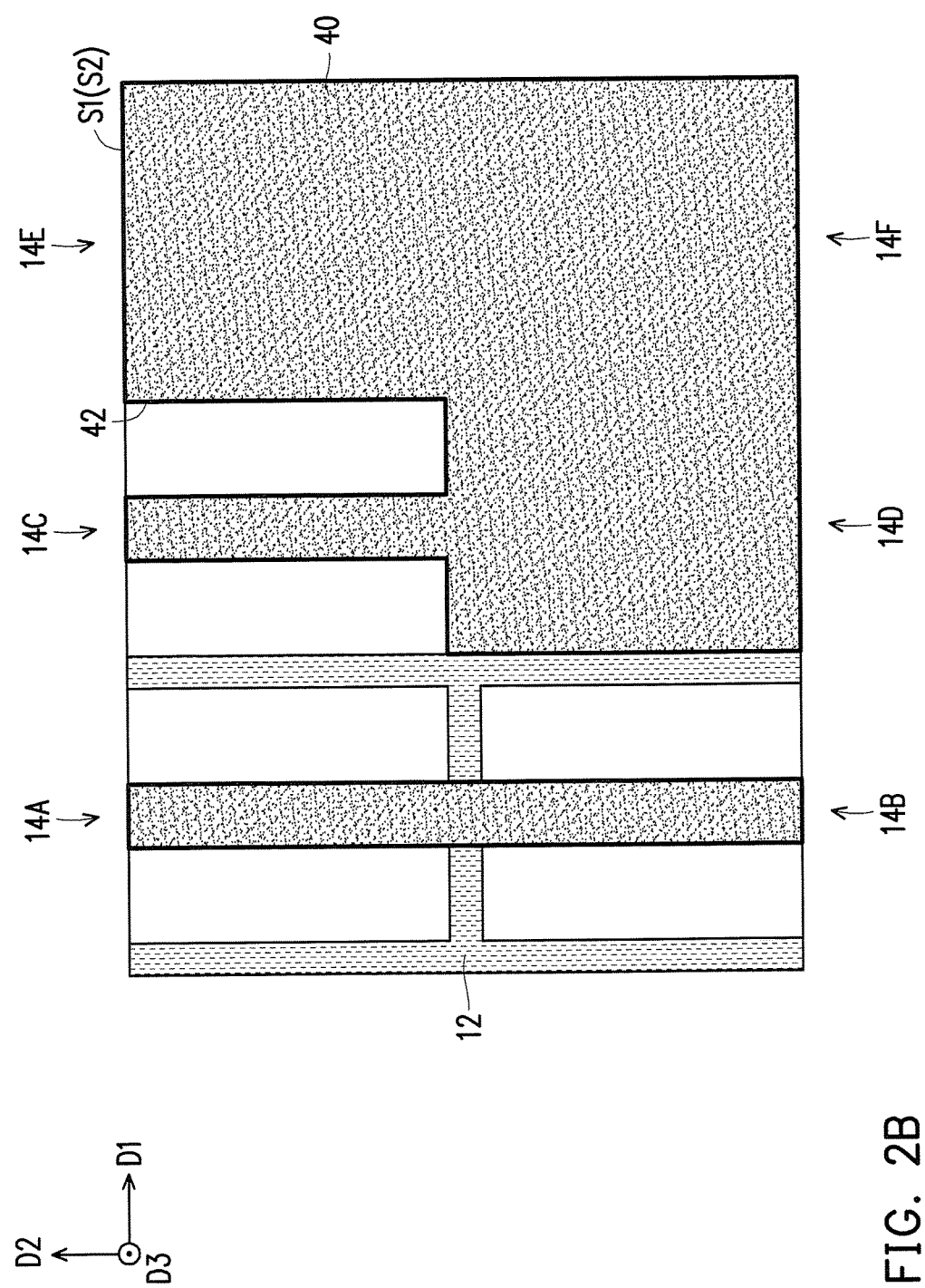
Figure 2C:
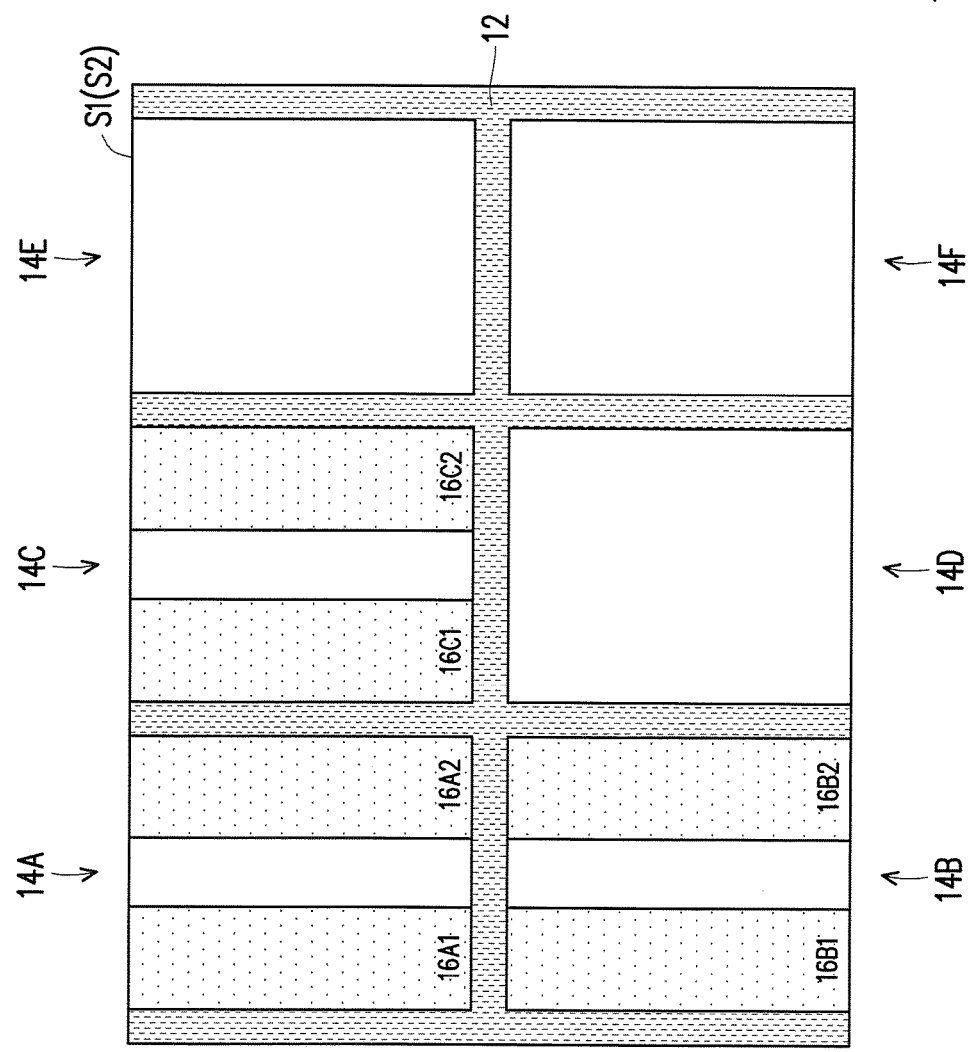
Figure 2C:
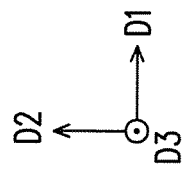
Figure 2D:
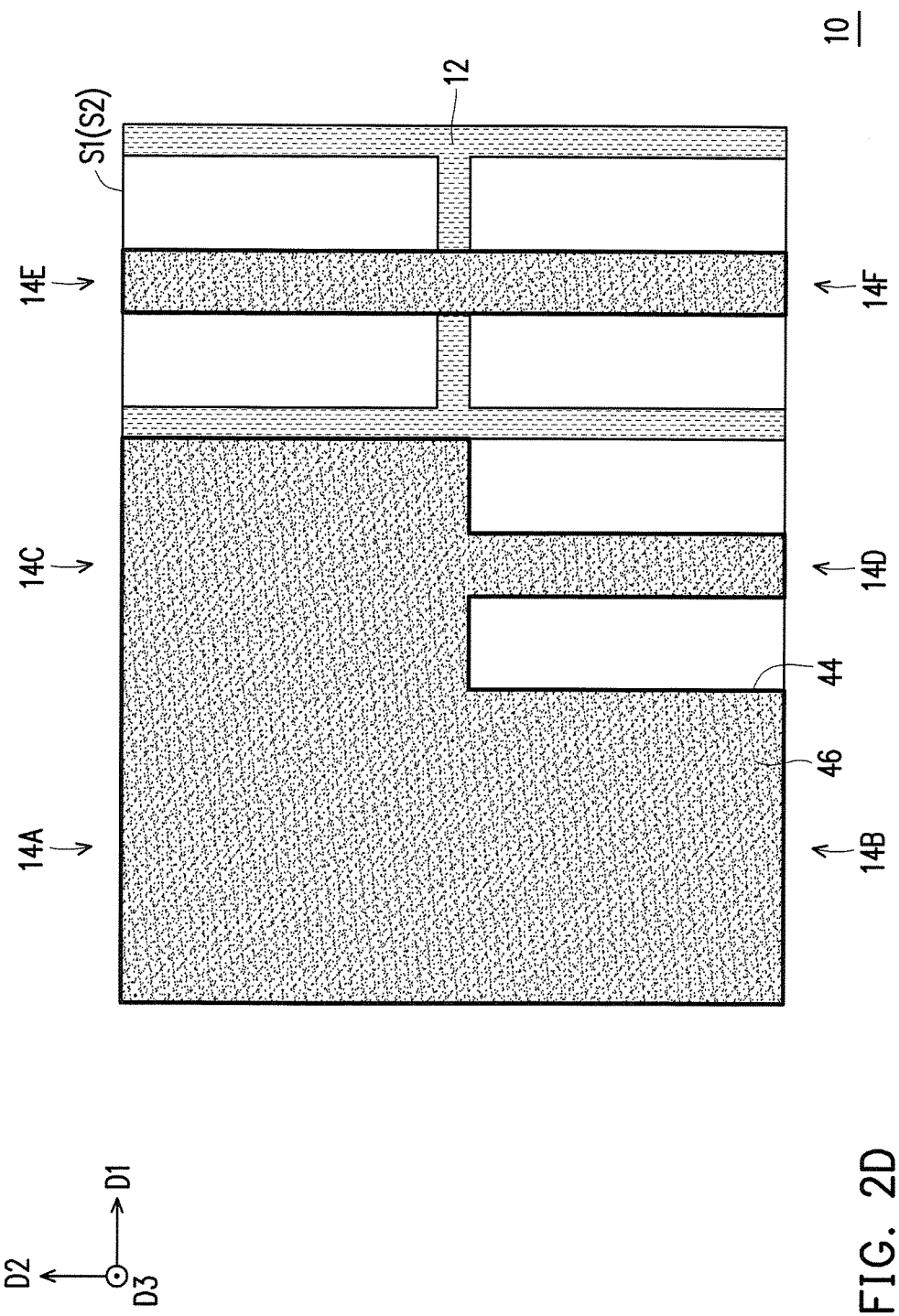
Figure 2E:
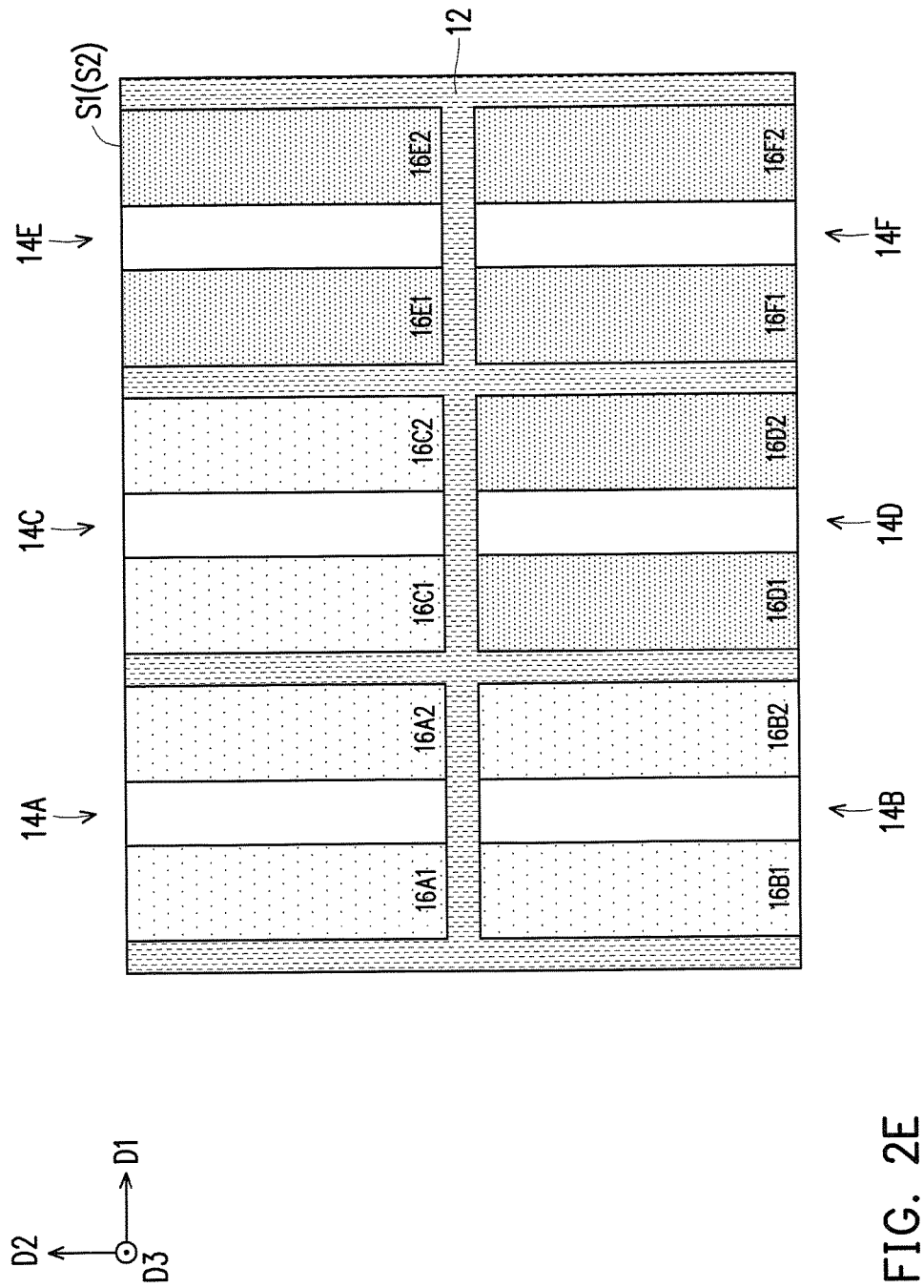
Figure 2F:
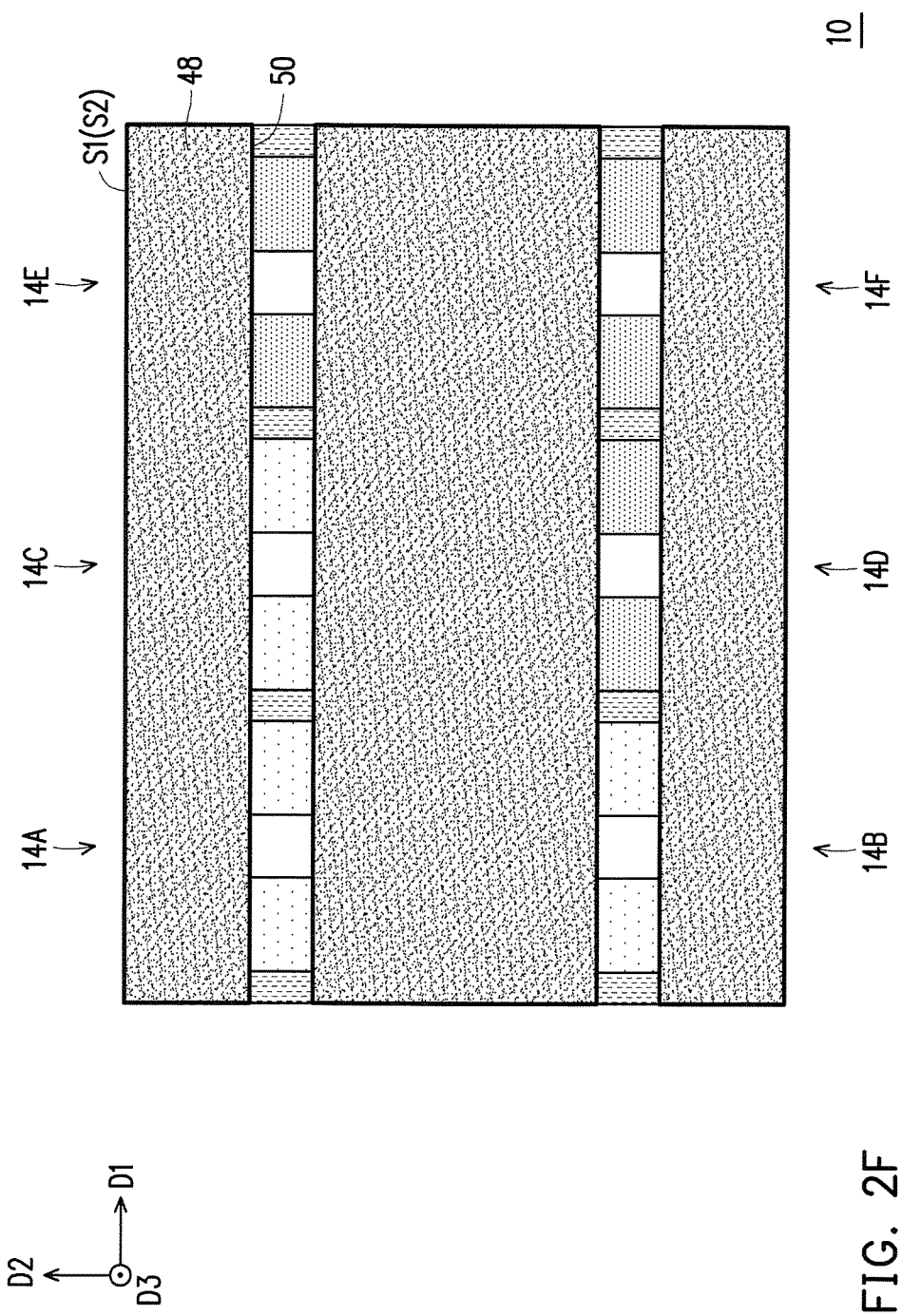

Then, referring to FIG. 2A to FIG. 2C, in some embodiments, a process of forming the doped blocks 16A1, 16A2, 16B1, 16B2, 16C1, and 16C2 shown in FIG. 2E includes forming a mask layer 40 (e.g., a patterned photoresist layer) covering the regions 14D to 14F, the isolation structure 12 beside these regions, a portion of the region 14A, a portion of the region 14B, and a portion of the region 14C. Then, an ion implantation process is performed to the regions 14A, 14B, and 14C exposed by a plurality of openings 42 of the mask layer 40. In an embodiment, the P-type dopant implanted in the ion implantation process is boron or $BF_2$, for example. Afterwards, the mask layer 40 is removed.

The doped blocks 16D1, 16D2, 16E1, 16E2, 16F1, and 16F2 shown in FIG. 2E may also be formed by performing a similar process. Namely, referring to FIGS. 2C to 2E, a mask layer (e.g., a patterned photoresist layer) 46 is formed on the substrate 10 to cover the regions 14A to 14C, the isolation structure beside these regions, a portion of the region 14D, a portion of the region 14E, and a portion of the region 14F. Then, an ion implantation process is performed to the regions 14D, 14E, and 14F exposed by a plurality of openings 44 of the mask layer 46. In an embodiment, the N-type dopant implanted in the ion implantation process is phosphorous or arsenic, for example. Afterwards, the mask layer 46 is removed.

Figure 2G:
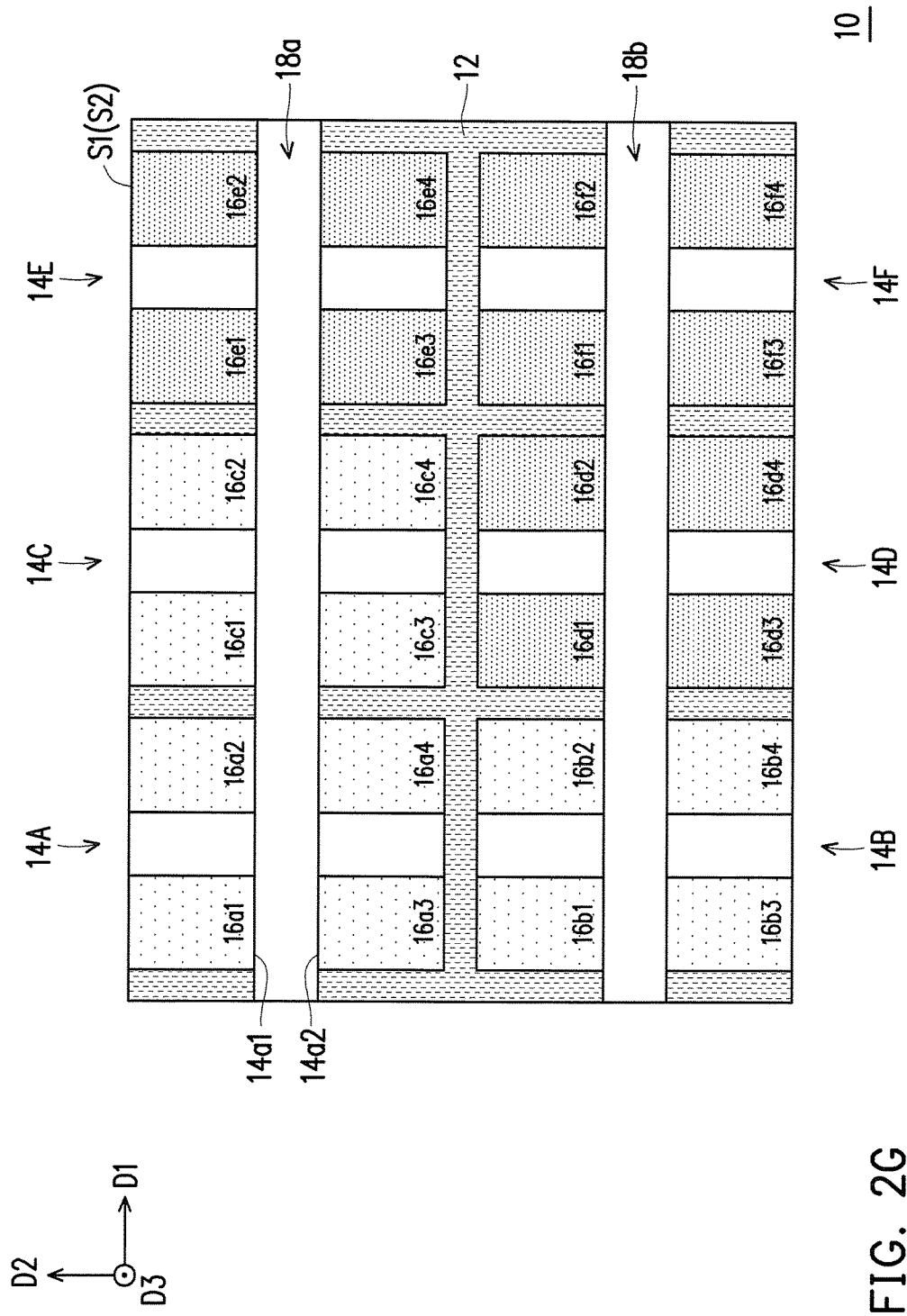
Figure 2H:
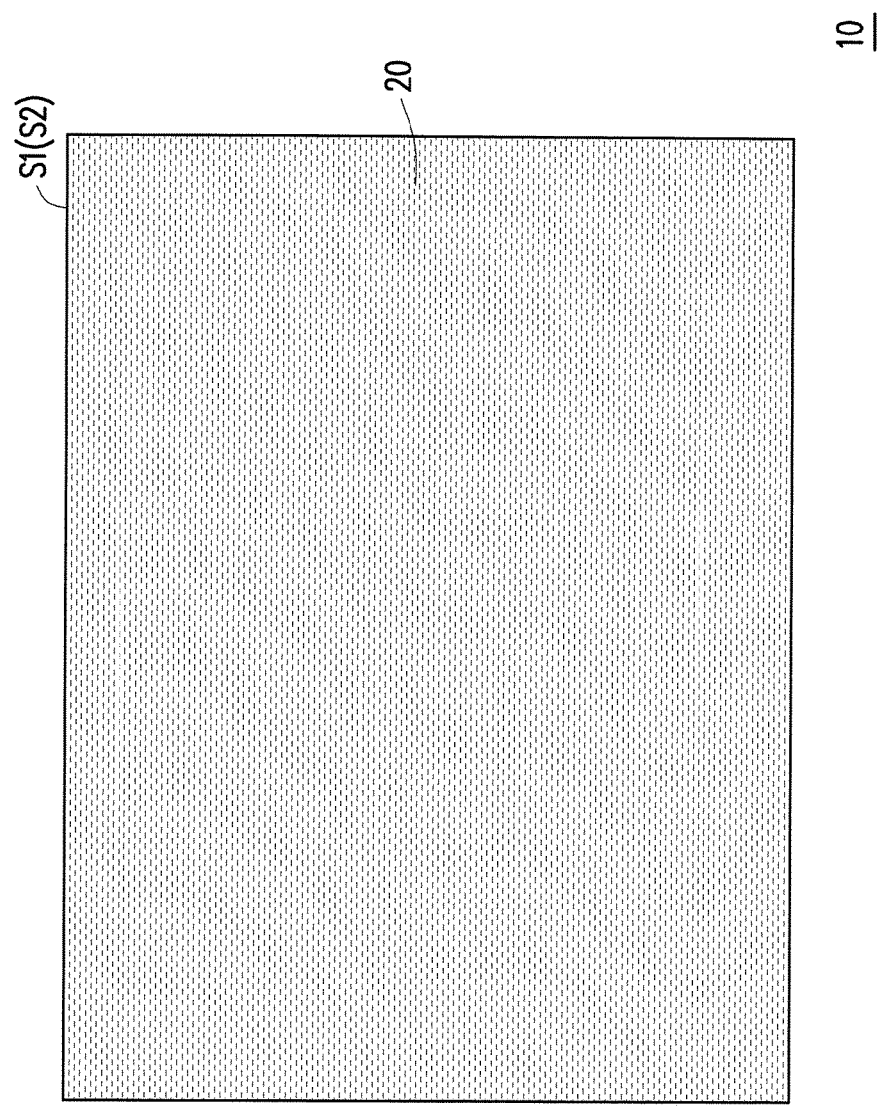

Then, referring to FIG. 1 and FIG. 2G, at Step S16, a plurality of trench walls 18a and 18b are formed in the substrate 10. The trench wall 18a extends along the first direction D1 and from the first surface S1 of the substrate 10 toward the second surface S2. The trench wall 18a divides the region 14A into island regions 14a1 and 14a2. Besides, the trench wall 18a also divides the doped block 16A1 in the region 14A into doped regions 16a1 and 16a3, and divides the doped block 16A2 into doped regions 16a2 and 16a4. The island region 14a1 is located at a side of the trench wall 18a and includes the doped regions 16a1 and 16a2 therein, whereas the island region 14a2 is located at another side of the trench wall 18a and includes the doped regions 16a3 and 16a4 therein. Similarly, the trench wall 18a divides the doped blocks 16C1 and 16C2 in the region 14C and the doped blocks 16E1 and 16E2 in the region 14E into doped regions 16c1 to 16c4 and doped regions 16e1 to 16e4 respectively. Similarly, the trench wall 18b extends along the first direction D1 and from the first surface S1 of the substrate 10 toward the second surface S2. After the trench wall 18b is formed, the region 14B includes doped regions 16b1 to 16b4, the region 14D includes doped regions 16d1 to 16d4, and the region 14F includes doped regions 16f1 to 16f4.

Referring to FIG. 1, FIG. 2F, and FIG. 2G, in some embodiments, a process of forming the trench walls 18a and 18b includes forming a mask layer 48 on the substrate 10. The mask layer 48 is, for example, a patterned photoresist layer. The mask layer 48 includes a plurality of openings 50 extending along the first direction D1. Afterwards, an etching process, such as an anisotropic etching process, is performed to the isolation structure 12, the substrate 10, and a portion of the doped blocks 16A1, 16A2, 16B1, 16B2, 16C1, 16C2, 16D1, 16D2, 16E1, 16E2, 16F1, and 16F2 that are exposed by the openings 50. Afterwards, the mask layer 48 is removed.

Figure 2I:
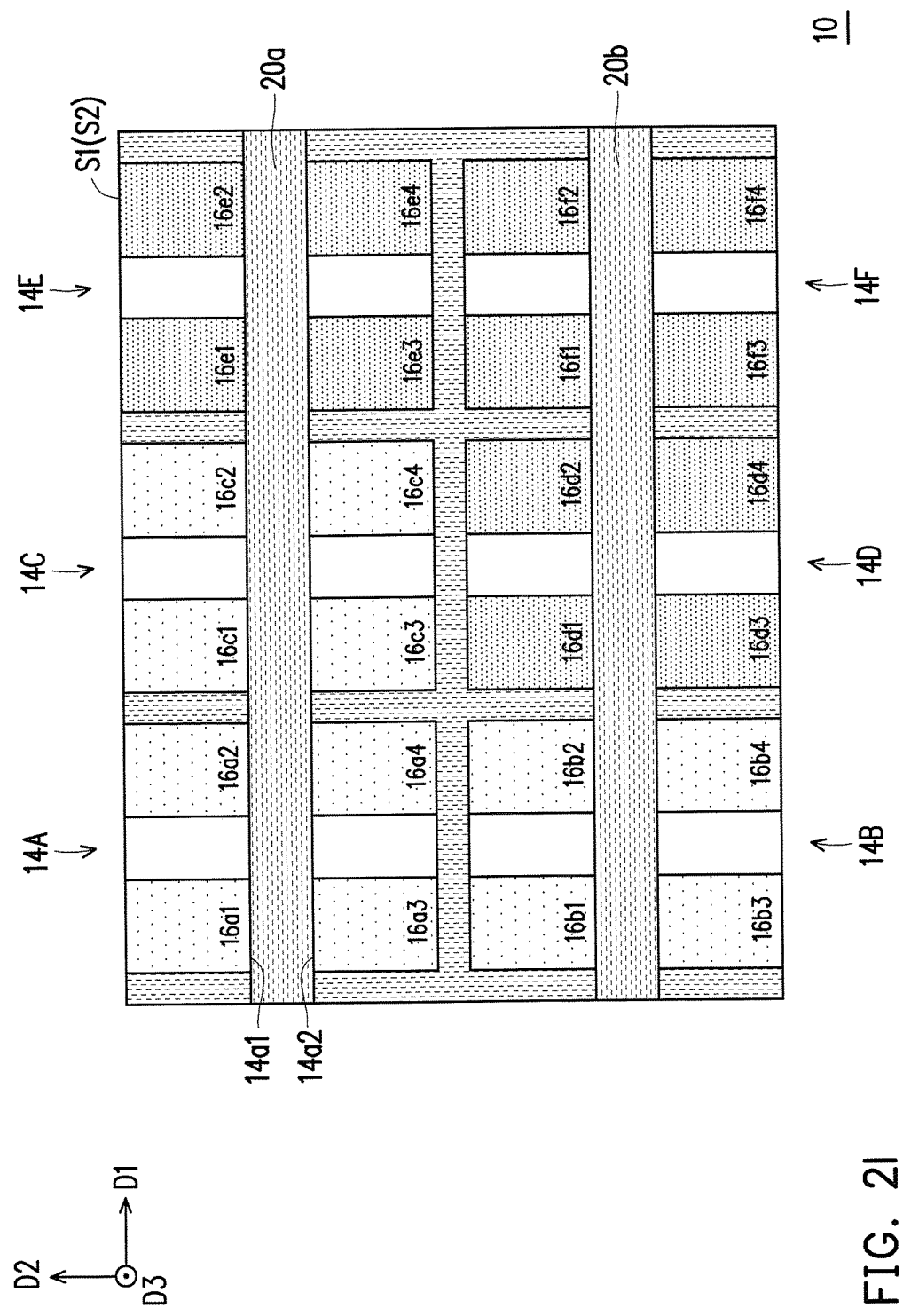
Figure 2J:
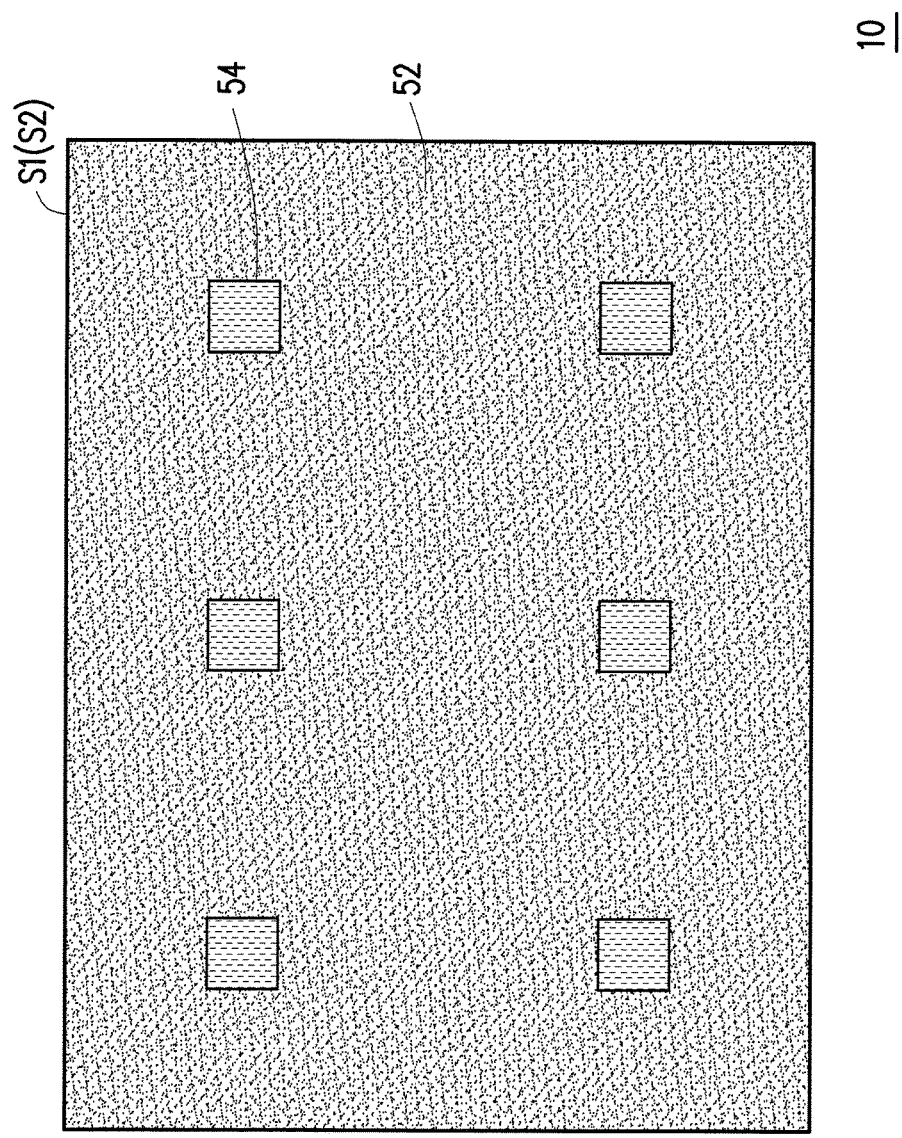

Then, referring to FIG. 1 and FIG. 2I, at Step S18, dielectric structures 20a and 20b are formed in the trench walls 18a and 18b. In some embodiments, the dielectric structures 20a and 20b are respectively dielectric walls.

Referring to FIG. 1, FIG. 2H, and FIG. 2I, in some embodiments, a process of forming the dielectric structures 20a and 20b includes, for example, forming a dielectric layer 20 on the substrate 10 and filling the dielectric layer 20 into the trench walls 18a and 18b, and then performing a planarization process to remove the dielectric layer 20 on a surface of the substrate 10, so that the dielectric structures 20a and 20b remain in the trench walls 18a and 18b. A material of the dielectric layer 20 includes silicon oxide, silicon nitride, silicon oxynitride, phosphosilicate glass (PSG), borophosphosilicate glass (BPSG), spin-on glass (SOG), undoped silicate glass (USG), fluorinated silica glass (FSG), carbon doped silicon oxide (e.g., SiCOH), polyimide, and/or a combination thereof. In some other embodiments, the dielectric layer 116 includes low-k dielectric materials. It should be noted that the low-k dielectric materials are generally dielectric materials having a dielectric constant lower than 3.9. Examples of low-k dielectric materials includes BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the dielectric layer 116 may include one or more dielectric materials and/or one or more dielectric layers. In some embodiments, the dielectric layer 20 is formed by performing CVD, HDPCVD, SACVD, spin-on, or other suitable processes. The planarization process includes performing a chemical mechanical polishing process, an etch-back process or a combination thereof, for example.

Figure 2K:
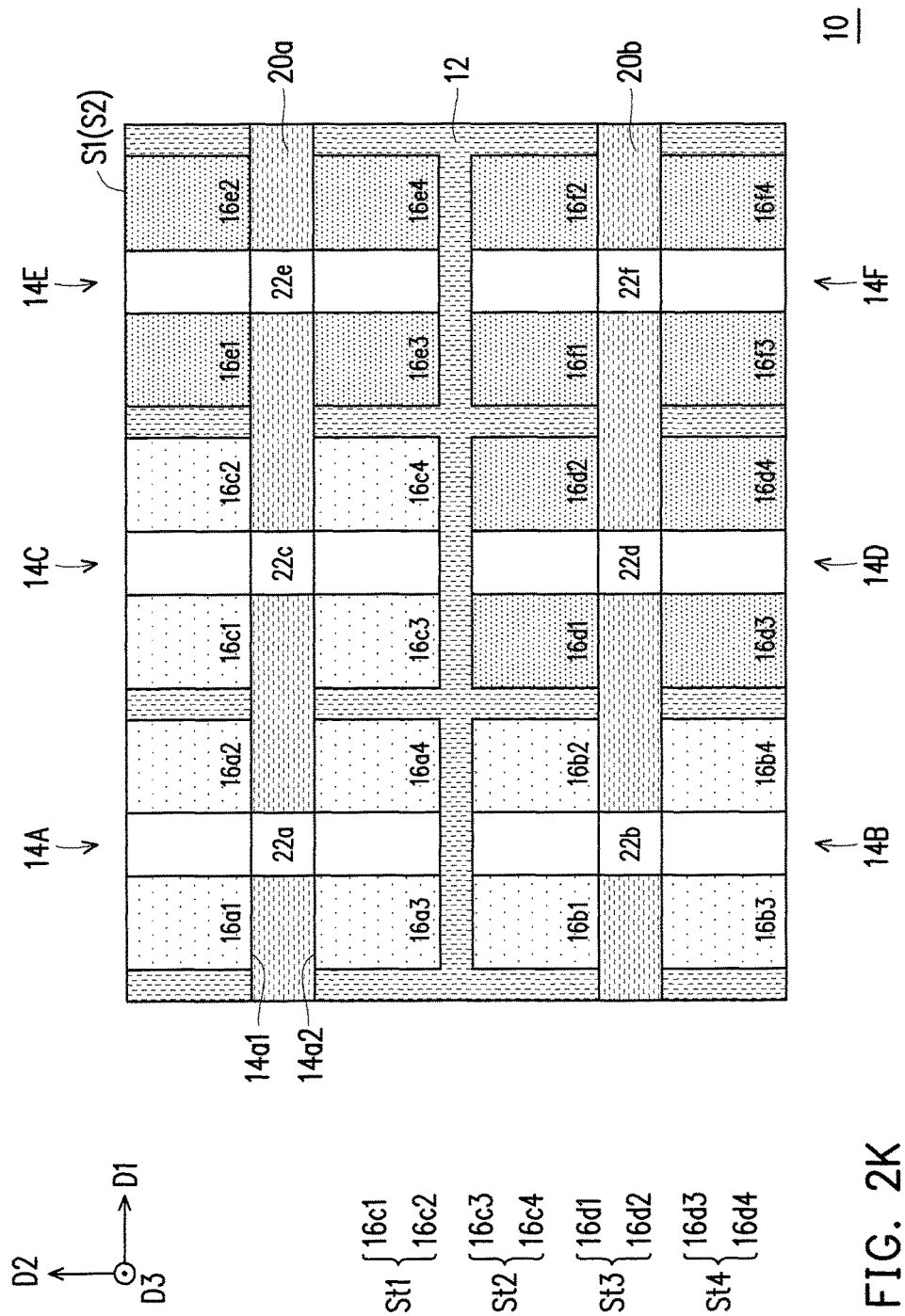

Then, referring to FIG. 1, FIG. 2I, and FIG. 2K, at Step S20, a plurality of gate holes 22a, 22c, 22e and 22b, 22d, 22f are formed in the dielectric structures 20a and 20b. The gate holes 22a to 22f have similar structures. Thus, details in this respect are described in the following by taking the gate hole 22a as an example. The gate hole 22a is located between the doped regions 16a1 to 16a4. Furthermore, the gate hole 22a extends from the first surface S1 of the substrate 10 toward the second surface S2. Namely, the gate hole 22a extends in a third direction D3. In some embodiments, the bottom of the gate hole 22a exposes the dielectric structures 20a. In alternative embodiments, the bottom of the gate hole 22a exposes the substrate 10.

Referring to FIG. 2J and FIG. 2K, in some embodiments, a process of aiming the gate holes 22a, 22c, 22e, and 22b, 22d, 22f includes forming a mask layer 52 on the substrate 10. The mask layer 52 is, for example, a patterned photoresist layer. The mask layer 52 has a plurality of openings 54. Then, an etching process, such as an anisotropic etching process, is performed to the dielectric structures 20a and 20b exposed by the openings 54 of the mask layer 52. Afterwards, the mask layer 52 is removed.

Figure 2L:
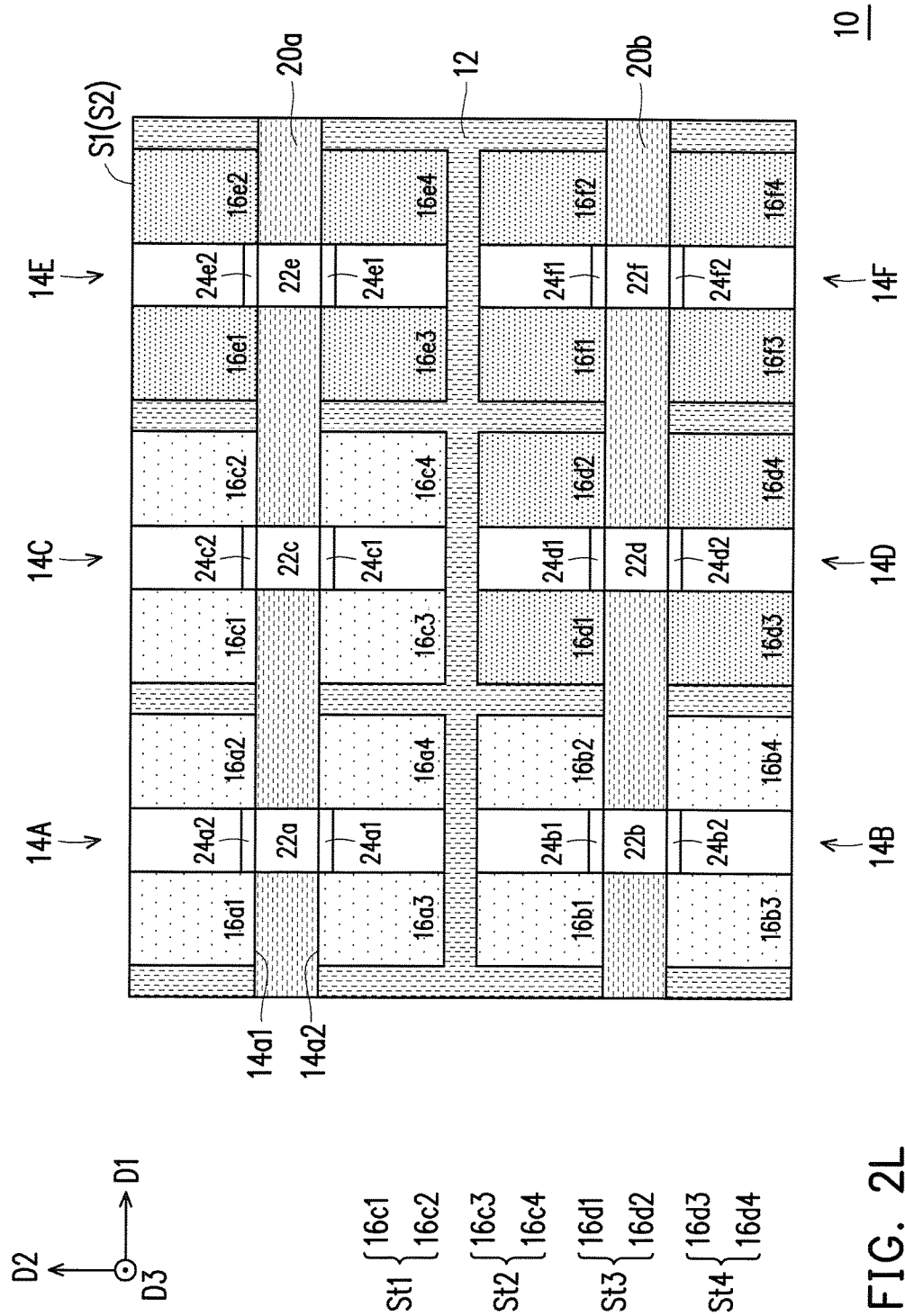

Referring to FIG. 1, FIG. 2K, and FIG. 2L, at Step S22, gate dielectric layers 24a1 and 24a2 are formed at surfaces of the substrate 10 exposed by a first sidewall SW1 and a second sidewall SW2 of the gate hole 22a. Similarly, the same arrangement applies to the gate holes 22b to 22f. In other words, gate dielectric layers 24b1 and 24b2, 24c1 and 24c2, 24d1 and 24d2, 24e1 and 24e2, and 24f1 and 24f2 are formed on the surfaces of the substrate 10 exposed by sidewalls of the gate holes 22b, 22c, 22d, 22e, and 22f. In some embodiments, another gate dielectric layers (not shown) may be further formed on the bottoms of the gate hole 22a, 22b, 22c, 22d, 22e, and 22f.

A material of the gate dielectric layers 24a1 and 24a2, 24b1 and 24b2, 24c1 and 24c2, 24d1 and 24d2, 24e1 and 24e2, and 24f1 and 24f2 includes silicon oxide, silicon nitride, silicon oxide, silicon oxynitride, a dielectric material having a dielectric constant greater than 7 (referred to as "a high-k material" throughout the description), or a combination thereof. In some embodiments, the high-k material includes metal oxide such as HfO, LaO, AlO, ZrO, TiO, $Ta_2O_5$, $Y_2O_3$, STO, BTO, BaZrO, HfZrO, HfLaO, HfTaO, HfTiO, a combination thereof, or a suitable material. In alternative embodiments, the high-k material can optionally include a silicate such as HfSiO, LaSiO, AlSiO, a combination thereof, or a suitable material, for example. In some embodiments, a method of forming the gate dielectric layers 24a1 and 24a2, 24b1 and 24b2, 24c1 and 24c2, 24d1 and 24d2, 24e1 and 24e2, and 24f1 and 24f2 includes performing a thermal oxidation process, for example, on the sidewalls and bottoms of the gate holes 22a to 22f. In alternative embodiments, a method of forming the gate dielectric layers 24a1 and 24a2, 24b1 and 24b2, 24c1 and 24c2, 24d1 and 24d2, 24e1 and 24e2, and 24f1 and 24f2 includes performing molecular-beam deposition (MBD), atomic layer deposition (ALD), chemical vapor deposition (CVD), physical vapor deposition (PVD), or the like, so that a gate dielectric material layer is formed on the sidewalls and the bottoms of the gate holes 22a to 22f and the first surface S1 of the substrate 10. Thereafter, the gate dielectric material layer on the first surface S1 of the substrate 10 is removed by a chemical mechanical polishing process, an etch-back process or a combination thereof, for example.

Figure 2M:
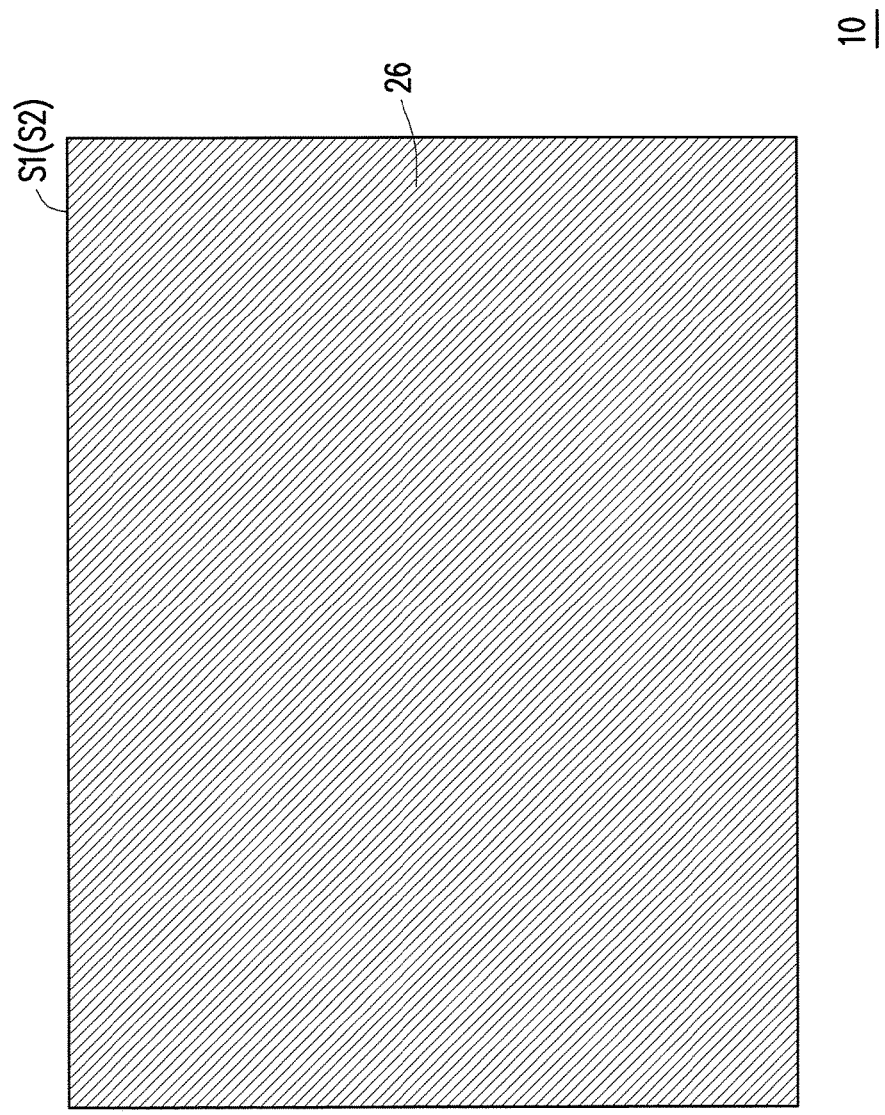
Figure 2M:
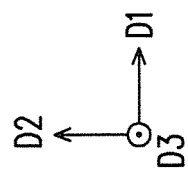
Figure 2N:
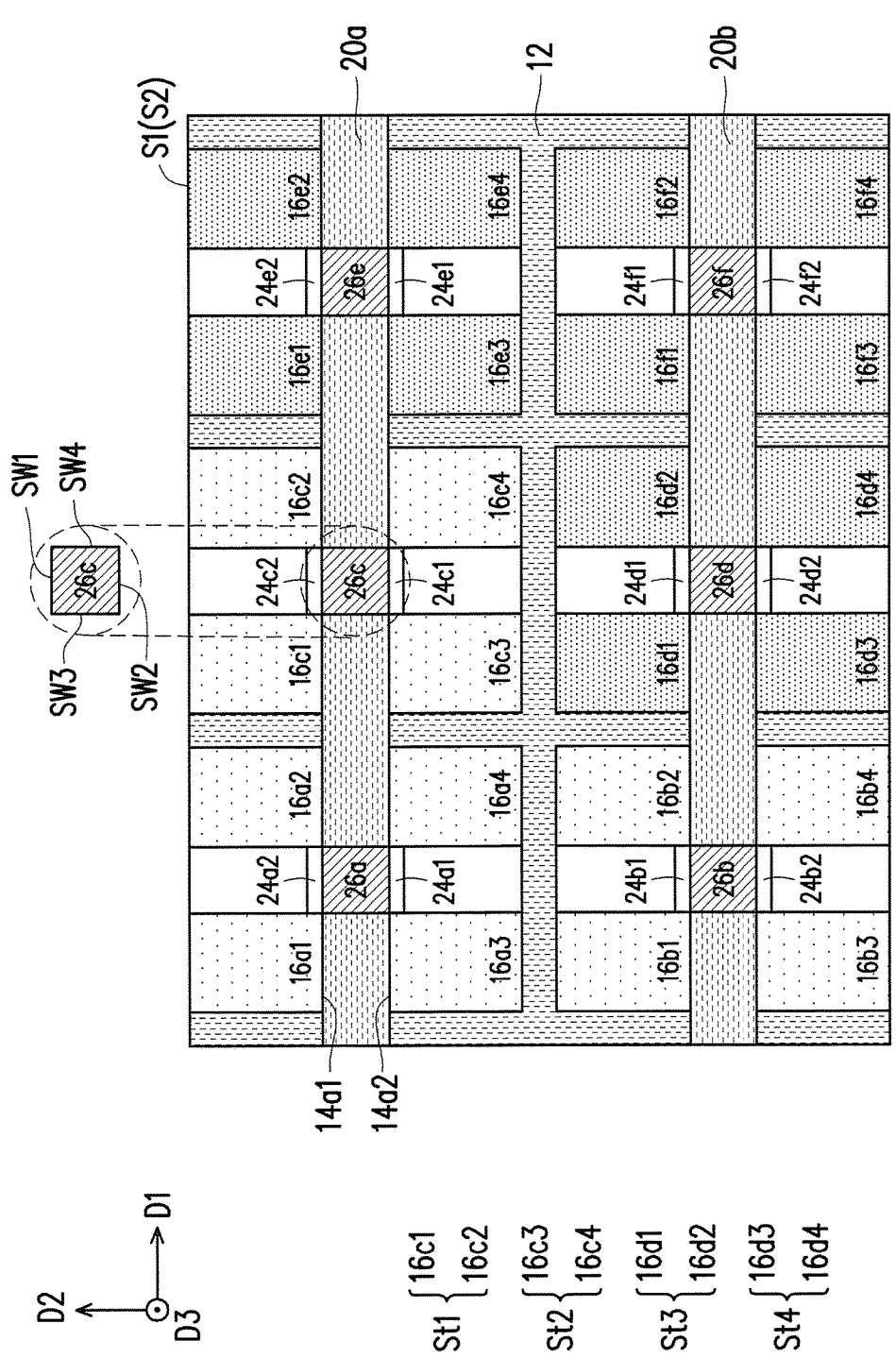

Continuing to refer to FIG. 1, FIG. 2L, and FIG. 2M, at Step S24, buried gate pillars 26a to 26f are formed in the gate holes 22a to 22f. In some embodiments, the buried gate pillars 26a to 26f includes silicon-containing material such as polysilicon or amorphous silicon. The method of forming the dummy layer includes performing a suitable process such as PVD, CVD or ALD. In alternative embodiments, the buried gate pillars 26a to 26f may include a barrier, a work function layer, a seed layer, an adhesion layer, a barrier layer, or a combination thereof. In some embodiments, the buried gate pillars 26a to 26f include suitable metals, such as TiN, WN, TaN, or Ru for a PMOS device. In some alternative embodiments, the buried gate pillars 26a to 26f include suitable metals, such as Ti, Ag, Al, TiAl, TiAlN, TaC, TaCN, TaSiN, Mn, or Zr for an NMOS device.

In some embodiment, a process of forming the buried gate pillar 26a to 26f includes, for example, forming a gate material layer 26 in the gate holes 22a to 22f and over the substrate 10 and performing a planarization process to remove the gate material layer 26 over the substrate 10, so as to form the buried gate pillars 26a to 26f in the gate holes 22a to 22f. A material of forming the gate material layer 26 includes silicon-containing material such as polysilicon or amorphous silicon, for example. The planarization process includes performing a chemical mechanical polishing process, an etch-back process or a combination thereof, for example.

In alternative embodiments, the buried gate pillars 26a to 26f may include a barrier, a work function layer, a seed layer, an adhesion layer, a barrier layer, or a combination thereof. In some embodiments, the buried gate pillars 26a to 26f includes suitable metals, such as TiN, WN, TaN, or Ru for a PMOS device. In some alternative embodiments, the buried gate pillars 26a to 26f includes suitable metals, such as Ti, Ag, Al, TiAl, TiAlN, TaC, TaCN, TaSiN, Mn, or Zr for an NMOS device.

Figures 3A, 3B:
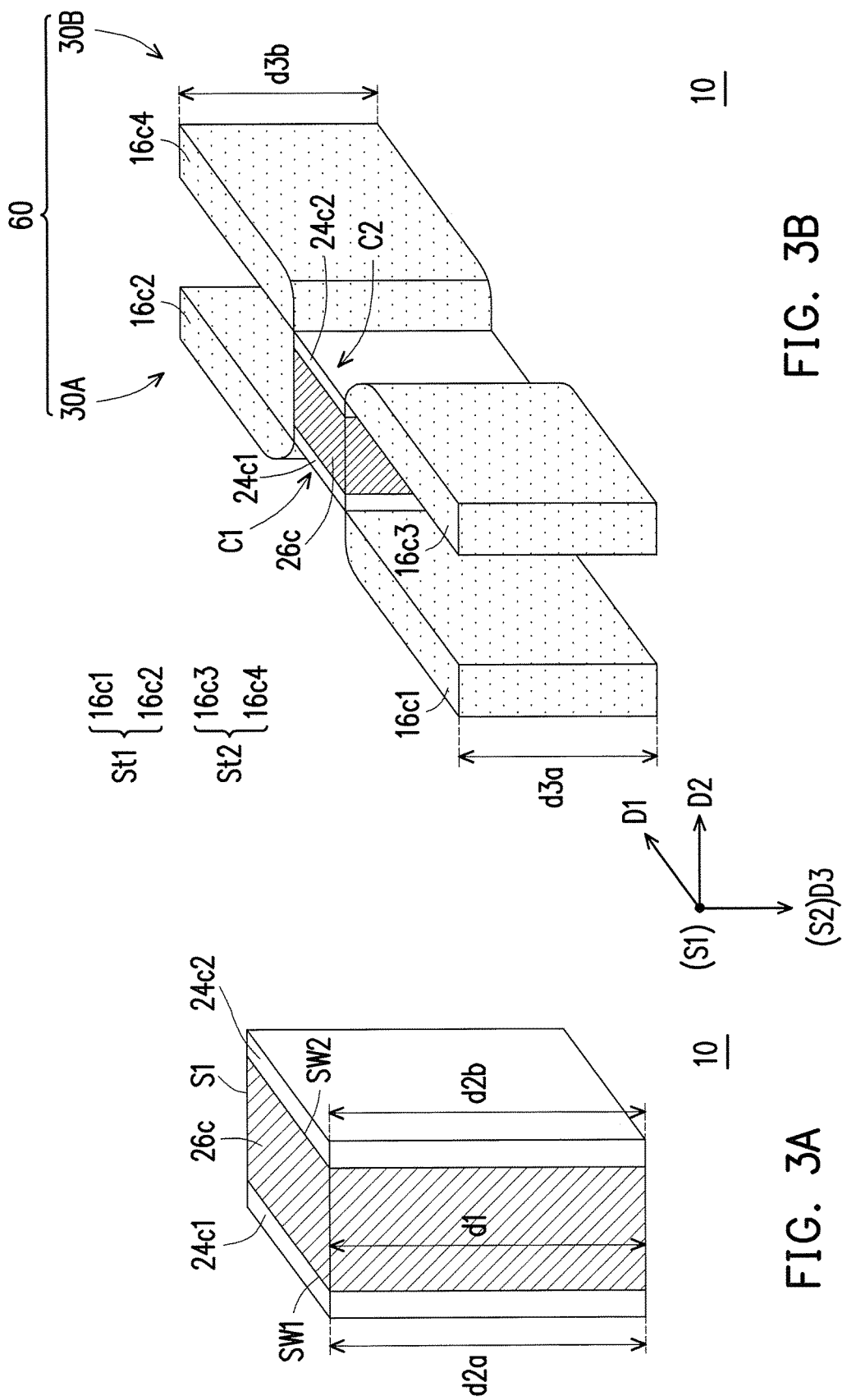
FIG. 3A is a perspective view illustrating a portion of a first semiconductor device according to some embodiments of the disclosure.
FIG. 3B is a perspective view illustrating a first semiconductor device according to some embodiments of the disclosure.

FIG. 3A is a perspective view illustrating a portion of a first semiconductor device according to some embodiments of the disclosure. FIG. 3B is a perspective view illustrating a first semiconductor device according to some embodiments of the disclosure.

Referring to FIG. 2N, FIG. 3A and FIG. 3B, a first semiconductor device 60 having a buried gate pillar according to some embodiments of the disclosure comprises a first portion 30A and a second portion 30B. In some embodiments, the first semiconductor device 60 is a first metal oxide semiconductor device. The first portion 30A and the second portion 30B have channels C1 and C2 of the same conductivity type. In an embodiment, the first portion 30A and the second portion 30B have P-type channels. The first semiconductor device 60 is a PMOS transistor having dual channels C1 and C2, for example.

The first portion 30A and the second portion 30B are embedded into the substrate 10. The first portion 30A and the second portion 30B share a buried gate pillar 26c. The buried gate pillar 26c extends from the first surface S1 of the substrate 10 toward the second surface S2 opposite to the first surface S1. Namely, the buried gate pillar 26c extends along the third direction D3.

More specifically, the first portion 30A includes the buried gate pillar 26c, a gate dielectric layer 24c1 (also referred to as first gate dielectric layer), and a first doped region set St1.

The buried gate pillar 26c is located in the substrate 10 and extends from the first surface S1 of the substrate 10 toward the second surface S2. Namely, the buried gate pillar 26c extends along the third direction D3. In addition, the buried gate pillar 26c has a depth d1.

The first gate dielectric layer 24c1 is located between the first sidewall SW1 of the buried gate pillar 26c and the substrate 10, extends from the first surface S1 of the substrate 10 toward the second surface S2. Namely, the first gate dielectric layer 24c1 extends along the third direction D3. In addition, the first gate dielectric layer 24c1 has a depth d2a. In some embodiments, the depth d2a of the first gate dielectric layer 24c1 is similar to or deeper than the depth d1 of the buried gate pillar 26c.

The first doped region set St1 includes the doped regions 16c1 and 16c2. The doped regions 16c1 and 16c2 are located beside the first gate dielectric layer 24c1 and extend from the first surface S1 of the substrate 10 toward the second surface S2. Namely, the doped regions 16c1 and 16c2 extend along the third direction D3. In addition, the doped regions 16c1 and 16c2 have a depth d3a. In some embodiment, the depth d3a of the first doped region set St1 is similar or equal to the depth d2a of the first gate dielectric layer 24c1 or the depth d1 of the buried gate pillar 26c. In some embodiments, the doped region 16c1 and the doped region 16c2 are respectively a first source region and a first drain region.

A first channel C1 is provided in the substrate 10 between the first gate dielectric layer 24c1 and the doped regions 16c1 and 16c2. In other words, a length of the first channel C1 of the first portion 30A is a distance between the doped region 16c1 and 16c2. A width of the first channel C1 is similar or equal to the depth d3a of the doped regions 16c1 and 16c2, the depth d2a of the first gate dielectric layer 24c1 or the depth d1 of the buried gate pillar 26c.

Similarly, the second portion 30B includes the buried gate pillar 26c, a gate dielectric layer 24c2 (also referred to as second gate dielectric layer), and a second doped region set St2.

In the second portion 30B, the buried gate pillar 26c is located in the substrate 10 and extends from the first surface S1 of the substrate 10 toward the second surface S2. Namely, the buried gate pillar 26c extends along the third direction D3. In addition, the buried gate pillar 26c has the depth d1.

The second gate dielectric layer 24c2 is located between the second sidewall SW2 of the buried gate pillar 26c and the substrate 10, extends from the first surface S1 of the substrate 10 toward the second surface S2. Namely, the second gate dielectric layer 24c2 extends along the third direction D3. In addition, the second gate dielectric layer 24c2 has a depth d2b. In some embodiments, the depth d2b of the second gate dielectric layer 24c2 is similar to or deeper than the depth d1 of the buried gate pillar 26c.

The second doped region set St2 includes the doped regions 16c3 and 16c4. The doped regions 16c3 and 16c4 are located beside the second gate dielectric layer 24c2 and extend from the first surface S1 of the substrate 10 toward the second surface S2. Namely, the doped regions 16c3 and 16c4 extend along the third direction D3. In addition, the doped regions 16c3 and 16c4 have a depth d3b. In some embodiment, the depth d3b of the second doped region set St2 is similar or equal to the depth d2b of the second gate dielectric layer 24c2 or the depth d1 of the buried gate pillar 26c. In some embodiments, the doped region 16c3 and the doped region 16c4 are respectively a second source region and a second drain region.

A second channel C2 is provided in the substrate 10 between the second gate dielectric layer 24c2 and the doped regions 16c3 and 16c4. In other words, a length of the second channel C2 of the second portion 30B is a distance between the doped region 16c3 and 16c4. The length of the second channel C2 is similar or equal to the depth d3b of the doped regions 16c3 and 16c4, the depth d2b of the second gate dielectric layer 24c2 or the depth d1 of the buried gate pillar 26c.

Referring to FIG. 2N, FIG. 3A and FIG. 3B, in some embodiments, the doped regions 16c1 to 16c4 may be arranged into an array. The buried gate pillar 26c is located between the doped regions 16c1 to 16c4. The doped region 16c1 and the doped region 16c2 are respectively the first source region and the first drain region. The doped region 16c3 and the doped region 16c4 are respectively the second source region and the second drain region. In other words, the first source region and the first drain region are arranged along the first direction D1 as a first row of the array, whereas the second source region and the second drain region are arranged along the first direction D1 as a second row of the array. The first source region and the second source region are arranged along the second direction D2 as a first column of the array, whereas the first drain region and the second drain region are arranged along the second direction D2 as a second column of the array. The isolation structure 12 is located beside the array.

Referring to FIG. 2N, FIG. 3A and FIG. 3B, in some embodiments, the first gate dielectric layer 24c1 and the second gate dielectric layer 24c2 are respectively located at the first sidewall SW1 and the second sidewall SW2 of the buried gate pillar 26c, and the dielectric structure 20a is located beside the third sidewall SW3 and the fourth sidewall SW4 of the buried gate pillar 26c. The dielectric structure 20a separates the doped region 16c1 from the doped region 16c3 and the doped region 16c2 from the doped region 16c4.

In an embodiment, when the first semiconductor device 60 having dual channels C1 and C2 is operated, the same first voltage may be applied to the doped region 16c1 (i.e., the first source region) of the first portion 30A and the doped region 16c3 (i.e., the second source region) of the second portion 30B, and the same second voltage may be applied to the doped region 16c2 (i.e., the first drain region) of the first portion 30A and the doped region 16c4 (i.e., the second drain region) of the second portion 30B. In addition, a gate voltage is applied to the buried gate pillar 26c, so as to turn on the first channel C1 and the second channel C2 at the same time. Accordingly, a saturation current is increased and an operation speed of the device is facilitated as well.

Figures 4A, 4B:
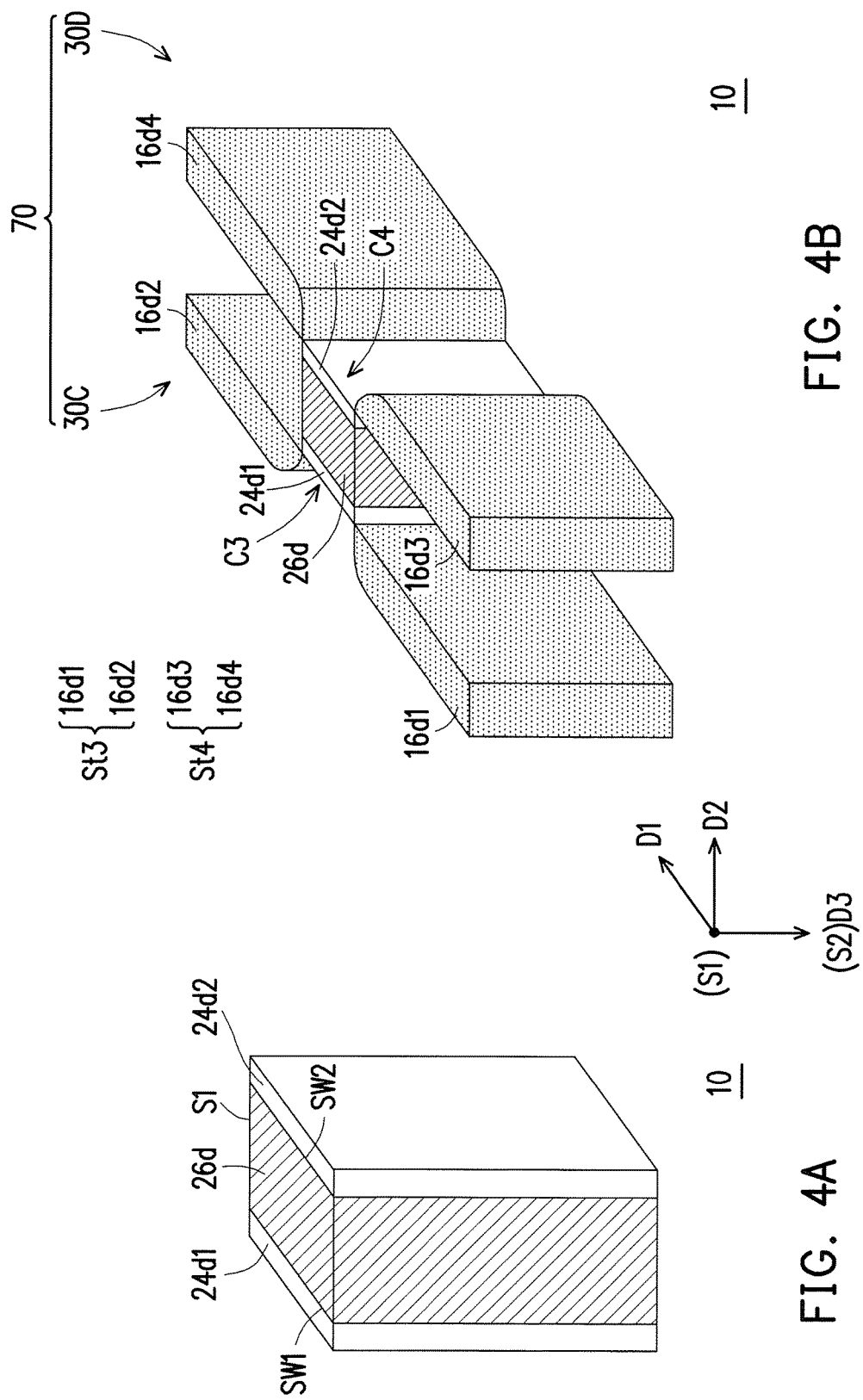
FIG. 4A is a perspective view illustrating a portion of a second semiconductor device according to some embodiments of the disclosure.
FIG. 4B is a perspective view illustrating a second semiconductor device according to some embodiments of the disclosure.

FIG. 4A is a perspective view illustrating a portion of a second semiconductor device according to some embodiments of the disclosure. FIG. 4B is a perspective view illustrating a second semiconductor device according to some embodiments of the disclosure.

Referring to FIG. 2N and FIGS. 3A and 4A, the complementary metal oxide semiconductor device having the buried gate pillars according to some embodiments of the disclosure includes a first semiconductor device 60 having two channels of the first conductivity type and a second semiconductor device 70 having two channels of the second conductivity type. In some embodiments, the first semiconductor device 60 is a first MOS device and the second semiconductor device 70 is a second MOS device.

Referring to FIG. 2F and FIGS. 3A and 4A, the first semiconductor device 60 includes the first portion 30A and the second portion 30B, and the second semiconductor device 70 includes a third portion 30C and a fourth portion 30D. The first portion 30A and the second portion 30B have channels C1 and C2 of the same conductivity type. The third portion 30C and the fourth portion 30D have channels C3 and C4 of the same conductivity type. In an embodiment, the first portion 30A and the second portion 30B have channels C1 and C2 of the first conductivity type, whereas the third portion 30C and the fourth portion 30D have channels C3 and C4 of the second conductivity type. In some embodiments, the first portion 30A and the second portion 30B have P-type channels, whereas the third portion 30C and the fourth portion 30D have N-type channels. The first semiconductor device 60 having the P-type channels is a PMOS transistor, for example, whereas the second semiconductor device 70 having the N-type channels is an NMOS transistor, for example.

The first portion 30A and the second portion 30B are embedded into the substrate 10 and share the buried gate pillar 26c (also referred to as first buried gate pillar). Details in this regard are already described above and thus will not be repeated in the following. In the following, the third portion 30C and the fourth portion 30D will be described in detail.

Referring to FIG. 2F, FIG. 4A and FIG. 4B, the third portion 30C and the fourth portion 30D are embedded into the substrate 10. The third portion 30C and the fourth portion 30D share a buried gate pillar 26d (also referred to as second buried gate pillar). The buried gate pillar 26d extends from the first surface S1 of the substrate 10 toward the second surface S2. Namely, the buried gate pillar 26d extends along the third direction D3.

More specifically, the third portion 30C includes the buried gate pillar 26d, the gate dielectric layer 24d1 (also referred to as third gate dielectric layer), and a third doped region set St3 (i.e., the doped regions 16d1 and 16d2). The fourth portion 30D includes the buried gate pillar 26d, the gate dielectric layer 24d2 (also referred to as fourth gate dielectric layer), and a fourth doped region set St4 (i.e., the doped regions 16d3 and 16d4).

Materials and relative positions of the buried gate pillar 26d, the gate dielectric layer 24d1 (also referred to as third gate dielectric layer), the gate dielectric layer 24d2 (also referred to as fourth gate dielectric layer) are similar to the materials and relative positions of the buried gate pillar 26c, the gate dielectric layer 24c1 (also referred to as first gate dielectric layer) and the gate dielectric layer 24c2 (also referred to as second gate dielectric layer). Thus, details in these respects are not repeated in the following.

Relative positions of the third doped region set St3 (i.e., the doped regions 16d1 and 16d2) and the fourth doped region set St4 (i.e., the doped regions 16d3 and 16d4) are similar to relative positions of the first doped region set St1 (i.e., the doped regions 16c1 and 16c2) and the second doped region set St2 (doped regions 16c3 and 16c4), except that the conductivity type of dopants of the doped regions 16d1 to 16d4 differs from the conductivity type of dopants of the doped regions 16c1 to 16c4. In an embodiment, the doped regions 16c1 to 16c4 are of the first conductivity type, whereas the doped regions 16d1 to 16d4 are of the second conductivity type.

A third channel C3 is provided in the substrate 10 between the third gate dielectric layer 24d1 and the doped regions 16d1 and 16d2. A fourth channel C4 is provided in the substrate 10 between the fourth gate dielectric layer 24d2 and the doped regions 16d3 and 16d4.

In some embodiments, the second doped region set St2 (the doped regions 16c3 and 16c4) and the third doped region set St3 (the doped regions 16d1 and 16d2) are arranged into an array and separated from each other with the isolation structure 12. Besides, the isolation structure 12 is also located beside the array. The buried gate pillars 26c and 26d are located beside the array. The dielectric structure 20a is located beside the buried gate pillar 26c, and the dielectric structure 20b is located beside the buried gate pillar 26d.

In some embodiments of the disclosure, the semiconductor device is formed in the substrate. Also, the buried gate pillar, the gate dielectric layer, and the doped regions as the source and the drain buried in the substrate and extend from one surface of the substrate toward the other surface of the substrate, so as to reduce stacking of layers and generation of stress, and prevent the layers from being bent.

Further, in some embodiments of the disclosure, the buried gate pillar is formed in the gate hole, which is formed in the substrate. Thus, the profile of the buried gate pillar may not be damaged due to inappropriate control in the etching process for forming the gate.

In addition, the length of the channel in some embodiments of the disclosure may be adjusted and controlled based on the distance between the doped regions. The width of the channel extends from the surface of the substrate toward the other surface and may be controlled according to a vertical depth of the gate. Accordingly, a greater channel width is offered, and the operating speed of the device is facilitated.

Furthermore, when the semiconductor device having the buried gate pillar according to some embodiments of the disclosure is operated, two channels of the metal oxide semiconductor device may be turned on or off at the same time. When the two channels of the metal oxide semiconductor device are turned on at the same time, the saturation current is increased, so as to facilitate the operating speed.

In accordance with some embodiments of the present disclosure, a semiconductor device having dual channels includes a first portion and a second portion sharing a buried gate pillar extending from a first surface of a substrate toward a second surface opposite to the first surface. The first portion is embedded into a substrate and further includes a first gate dielectric layer and a first doped region set. The first gate dielectric layer is located between a first sidewall of the buried gate pillar and the substrate and extends from the first surface of the substrate toward the second surface. The first doped region set is located beside the first gate dielectric layer and extends from the first surface of the substrate toward the second surface. A first channel is provided in the substrate between the first gate dielectric layer and the first doped region set. In addition, the second portion is embedded into the substrate and further includes a second gate dielectric layer and a second doped region set. The second gate dielectric layer is located between a second sidewall of the buried gate pillar and the substrate and extends from the first surface of the substrate toward the second surface. The second doped region set is located beside the second gate dielectric layer and extends from the first surface of the substrate toward the second surface. A second channel is provided in the substrate between the second gate dielectric layer and the second doped region set.

In accordance with alternative embodiments of the present disclosure, a complementary semiconductor device includes a first metal oxide semiconductor device and a second metal oxide semiconductor device. The first metal oxide semiconductor device has a first channel and a second channel of a first conductivity type and embedded in a substrate. In addition, the first channel and the second channel are located in the substrate at sides of a first buried gate pillar and the first buried gate pillar extends from a first surface of the substrate toward a second surface opposite to the first surface. The second metal oxide semiconductor device has a third channel and a fourth channel of a second conductivity type and embedded in the substrate. In addition, the third channel and the fourth channel are located in the substrate at sides of the second buried gate pillar and the second buried gate pillar extends from the first surface of the substrate toward the second surface.

In accordance with yet alternative embodiments of the present disclosure, a method of manufacturing a semiconductor device having dual channels includes steps as follows. Two doped blocks of the same conductivity type are formed. In addition, the doped blocks extend from a first surface of a substrate toward a second surface opposite to the first surface, and the doped blocks are arranged along a direction. Then, a trench wall is formed. The trench wall extends from the first surface of the substrate toward the second surface, and is arranged along the direction and divides the doped regions into a first doped region set and a second doped region set. Then, a dielectric structure is formed in the trench wall. Subsequently, a gate hole is formed in the dielectric structure. The gate hole is located between the first doped region set and the second doped region set and extends from the first surface of the substrate toward the second surface. Then, two gate dielectric layers are formed on surfaces of the substrate exposed by two sidewalls of the gate hole. Subsequently, a buried gate pillar is formed between the two gate dielectric layers in the gate hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device having dual channels, comprising:
   a first portion and a second portion, sharing a buried gate pillar extending from a first surface of a substrate toward a second surface opposite to the first surface, wherein:
   the first portion is embedded into a substrate and further comprises:
      a first gate dielectric layer, located between a first sidewall of the buried gate pillar and the substrate and extending from the first surface of the substrate toward the second surface; and
      a first doped region set, located beside the first gate dielectric layer and extending from the first surface of the substrate toward the second surface, wherein a first channel is provided in the substrate between the first gate dielectric layer and the first doped region set; and
   the second portion is embedded into the substrate and further comprises:
      a second gate dielectric layer, located between a second sidewall of the buried gate pillar and the substrate and extending from the first surface of the substrate toward the second surface; and
      a second doped region set, located beside the second gate dielectric layer and extending from the first surface of the substrate toward the second surface, wherein a second channel is provided in the substrate between the second gate dielectric layer and the second doped region set.

2. The semiconductor device having the dual channels as claimed in claim 1, wherein the first doped region set and the second doped region set are arranged as an array.

3. The semiconductor device having the dual channels as claimed in claim 2, wherein
   the first doped region set comprises a first source region and a first drain region arranged along a first direction, and
   the second doped region set comprises a second source region and a second drain region arranged along the first direction,
   wherein the first source region and the second source region are arranged along a second direction, and the first drain region and the second drain region are arranged along the second direction.

4. The semiconductor device having the dual channels as claimed in claim 3, further comprising:
   a dielectric structure, arranged along the first direction, located beside a third sidewall and a fourth sidewall of the buried gate pillar, and separating the first doped region set and the second doped region set.

5. The semiconductor device having the dual channels as claimed in claim 3, further comprising an isolation structure located beside the array.

6. The semiconductor device having the dual channels as claimed in claim 3, wherein the first doped region set and the second doped region set are doped with dopants of the same conductivity type.

7. A complementary semiconductor device, comprising:
   a first metal oxide semiconductor device having a first channel and a second channel of a first conductivity type and embedded in a substrate, wherein the first channel and the second channel are located in the substrate at sides of a first buried gate pillar and the first buried gate pillar extends from a first surface of the substrate toward a second surface opposite to the first surface;
   a second metal oxide semiconductor device having a third channel and a fourth channel of a second conductivity type and embedded in the substrate, wherein the third channel and the fourth channel are located in the substrate at sides of the second buried gate pillar and the second buried gate pillar extends from the first surface of the substrate toward the second surface.

8. The complementary semiconductor device as claimed in claim 7, wherein the first metal oxide semiconductor device comprises a first portion and a second portion, sharing the first buried gate pillar,
   the first portion comprises:
      the first buried gate pillar;
      a first gate dielectric layer, located between a first sidewall of the first buried gate pillar and the substrate and extending from the first surface of the substrate toward the second surface; and
      a first doped region set of the first conductivity type, located beside the first gate dielectric layer and extending from the first surface of the substrate toward the second surface, wherein the first channel is provided in the substrate between the first gate dielectric layer and the first doped region set; and
   the second portion comprises:
      the first buried gate pillar;
      a second gate dielectric layer, located between a second sidewall of the first buried gate pillar and the substrate and extending from the first surface of the substrate toward the second surface; and
      a second doped region set of the first conductivity type, located beside the second gate dielectric layer and extending from the first surface of the substrate toward the second surface, wherein the second channel is provided in the substrate between the second gate dielectric layer and the second doped region set.

9. The complementary semiconductor device as claimed in claim 8, wherein the second metal oxide semiconductor device comprises a third portion and a fourth portion, sharing the second buried gate pillar,
   the third portion comprises:
      a third gate dielectric layer, located between a first sidewall of the second buried gate pillar and the substrate and extending from the first surface of the substrate toward the second surface; and
      a third doped region set of the second conductivity type, located beside the second gate dielectric layer and extending from the first surface of the substrate toward the second surface, wherein the third channel is provided in the substrate between the third gate dielectric layer and the third doped region set; and
   the fourth portion comprises:

a fourth gate dielectric layer, located between a second sidewall of the second buried gate pillar and the substrate and extending from the first surface of the substrate toward the second surface; and a fourth doped region set of the second conductivity type, located beside the second gate dielectric layer and extending from the first surface of the substrate toward the second surface, wherein the fourth channel is provided in the substrate between the second gate dielectric layer and the fourth doped region set.

10. The complementary semiconductor device as claimed in claim 9, wherein the first doped region set and the second doped region set are arranged as an array, and the third doped region set and the fourth doped region set are arranged as another array.

11. The complementary semiconductor device as claimed in claim 9, wherein the second doped region set and the third doped region set are arranged as an array.

12. The complementary semiconductor device as claimed in claim 11, wherein the first buried gate pillar and the second buried gate pillar are located beside the array.

13. The complementary semiconductor device as claimed in claim 9, wherein the first doped region set comprises a first source region and a first drain region arranged along a first direction, and the second doped region set comprises a second source region and a second drain region arranged along the first direction, the third doped region set comprises a third source region and a third drain region arranged along the first direction, and the fourth doped region set comprises a fourth source region and a fourth drain region arranged along the first direction, wherein the first source region, the second source region, the third source region, and the fourth source region are arranged along a second direction, the first drain region, the second drain region, the third drain region, and the fourth drain region are arranged along the second direction, and the first buried gate pillar and the second buried gate pillar are arranged along the second direction.

14. The complementary semiconductor device as claimed in claim 13, further comprising:

a first dielectric structure, separating the first doped region set and the second doped region set; and a second dielectric structure, separating the third doped region set and the fourth doped region set.

15. The complementary semiconductor device as claimed in claim 7, further comprising an isolation structure, separating the first metal oxide semiconductor device and the second metal oxide semiconductor device.

16. A method of manufacturing a semiconductor device having dual channels, comprising:

forming two doped blocks of the same conductivity type, wherein the doped blocks extend from a first surface of a substrate toward a second surface opposite to the first surface, and the doped blocks are arranged along a direction;

forming a trench wall, extending from the first surface of the substrate toward the second surface, arranged along the direction, and dividing the doped regions into a first doped region set and a second doped region set;

forming a dielectric structure in the trench wall;

forming a gate hole in the dielectric structure, wherein the gate hole is located between the first doped region set and the second doped region set and extends from the first surface of the substrate toward the second surface;

forming two gate dielectric layers on surfaces of the substrate exposed by two sidewalls of the gate hole; and forming a buried gate pillar between the two gate dielectric layers in the gate hole.

17. The method of manufacturing the semiconductor device having the dual channels as claimed in claim 16, further comprising forming an isolation structure before forming the doped blocks, wherein the doped blocks are located beside the isolation structure.

18. The method of manufacturing the semiconductor device having the dual channels as claimed in claim 16, wherein the step of forming the buried gate pillar comprises:

forming a gate material layer over the substrate, wherein the gate material layer is filled into the gate hole; and performing a planarization process to remove the gate material layer over the substrate.

19. The method of manufacturing the semiconductor device having the dual channels as claimed in claim 18, wherein the planarization process comprises performing a chemical mechanical polishing process, an etch-back process, or a combination thereof.

20. The method of manufacturing the semiconductor device having the dual channels as claimed in claim 16, wherein the step of forming the dielectric structure comprises:

forming a dielectric layer over the substrate, wherein the dielectric layer is filled into the trench wall; and performing a planarization process to remove the dielectric layer over the substrate.

* * * * *